United States Patent
Jann et al.

(10) Patent No.: US 12,316,022 B2
(45) Date of Patent: May 27, 2025

(54) INTERLEAVED SUB-SAMPLING PHASED ARRAY RECEIVER

(71) Applicant: Intel Corporation, Santa Clara, CA (US)

(72) Inventors: Benjamin Jann, Hillsboro, OR (US); Ashoke Ravi, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 829 days.

(21) Appl. No.: 17/352,394

(22) Filed: Jun. 21, 2021

(65) Prior Publication Data

US 2022/0407226 A1    Dec. 22, 2022

(51) Int. Cl.
| | | |
|---|---|---|
| *H01Q 3/38* | (2006.01) | |
| *H01Q 3/26* | (2006.01) | |
| *H03H 17/02* | (2006.01) | |
| *H03M 1/66* | (2006.01) | |
| *H04B 7/08* | (2006.01) | |
| *H04L 7/08* | (2006.01) | |
| *H03H 17/00* | (2006.01) | |

(52) U.S. Cl.
CPC ............ *H01Q 3/38* (2013.01); *H01Q 3/2605* (2013.01); *H03H 17/02* (2013.01); *H03M 1/66* (2013.01); *H04B 7/0848* (2013.01); *H04L 7/08* (2013.01); *H03H 2017/0081* (2013.01)

(58) Field of Classification Search
CPC ........ H01Q 3/38; H01Q 3/2605; H03H 17/02; H03H 2017/0081; H03M 1/66; H04B 7/0848; H04L 7/08
USPC ........................................................ 375/349
See application file for complete search history.

(56) References Cited

U.S. PATENT DOCUMENTS

| | | | | |
|---|---|---|---|---|
| 2009/0115650 A1* | 5/2009 | Tietjen | ................. | H04B 1/0007 341/155 |
| 2016/0020781 A1* | 1/2016 | Baringer | ................. | H03M 3/46 341/110 |
| 2024/0111045 A1* | 4/2024 | Meral | ................. | G01S 15/8968 |

OTHER PUBLICATIONS

Jain et al., "A 10GHz CMOS RX Frontend with Spatial Cancellation of Co-channel Interferers for MIMO/Digital Beamforming Arrays", 2016 IEEE Radio Frequency Integrated Circuits Symposium (RFIC), May 22-24, 2016, 4 pages, IEEE.

(Continued)

*Primary Examiner* — Kevin M Burd
(74) *Attorney, Agent, or Firm* — Viering, Jentschura & Partner mbB

(57) ABSTRACT

A phased array may include a clock stage configured to generate shifted clock signals. Each shifted clock signal may include a different phase. The phased array may also include a beamforming stage configured to generate a beamformed signal that includes a beam formed in a direction based on summed signals. In addition, the phased array may include slices. Each slice may include a filter stage and a feedback stage. The filter stage may be configured to generate a corresponding summed signal by filtering a portion of blocker and noise interference in a corresponding receive signal based on blocking signals and the shifted clock signals. The feedback stage may be configured to generate the blocking signals based on the shifted clock signals and the corresponding summed signal. The blocking signals may be representative of the blocker and noise interference in the corresponding receive signal.

20 Claims, 2 Drawing Sheets

(56) References Cited

OTHER PUBLICATIONS

Jann et al., "28GHz RX frontends with sub-harmonic-based mm-wave LO Generation in 16nm FinFET", 2021 IEEE 20th Topical Meeting on Silicon Monolithic Integrated Circuits in RF Systems (SiRF), Jan. 17-20, 2021, 3 pages, IEEE.

Zhang et al., "A 0.1-to-3.1GHZ 4-Element MIMO Receiver Array Supporting Analog/RF Arbitrary Spatial Filtering", 2017 IEEE International Solid-State Circuits Conference (ISSCC), Feb. 8, 2017, p. 410-412, IEEE.

* cited by examiner

INTERLEAVED SUB-SAMPLING PHASED ARRAY RECEIVER

TECHNICAL FIELD

The aspects discussed in the present disclosure are related to an interleaved sub-sampling phased array receiver.

BACKGROUND

Unless otherwise indicated in the present disclosure, the materials described in the present disclosure are not prior art to the claims in the present application and are not admitted to be prior art by inclusion in this section.

Base stations may include an antenna array and a receiver. The antenna array may receive multiple receive signals representative of a signal generated by an electronic device. The receiver may sample the receive signals to reconstruct the signal generated by the electronic device. The receiver may be configured to directly sample the receive signals over multiple frequency bands.

The subject matter claimed in the present disclosure is not limited to aspects that solve any disadvantages or that operate only in environments such as those described above. Rather, this background is only provided to illustrate one example technology area where some aspects described in the present disclosure may be practiced.

BRIEF DESCRIPTION OF THE DRAWINGS

Example aspects will be described and explained with additional specificity and detail through the use of the accompanying drawings in which.

DETAILED DESCRIPTION

Figure 1:
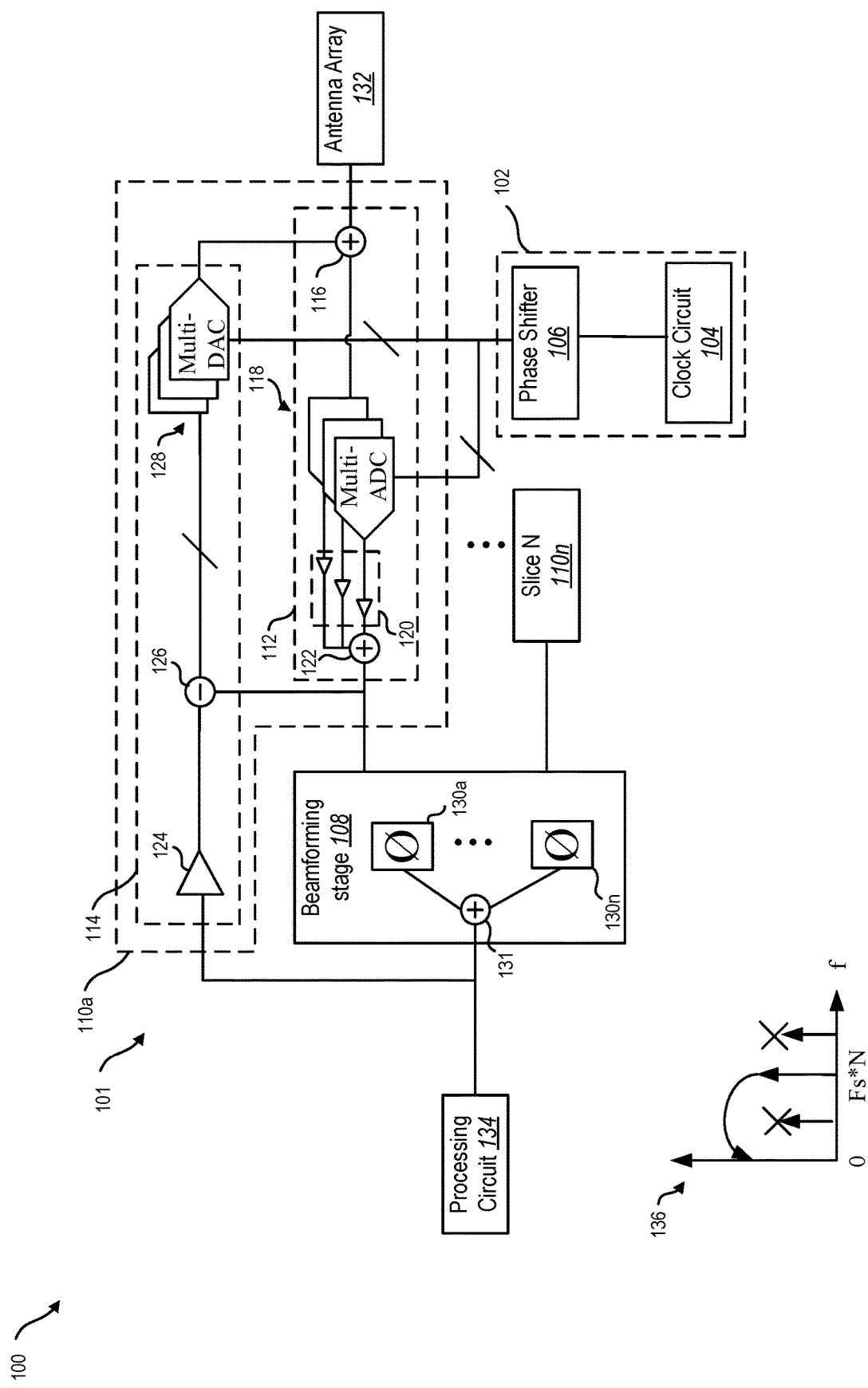
FIG. 1 illustrates a block diagram of an exemplary receiver of a base station that includes a phased array.

The following detailed description refers to the accompanying drawings that show, by way of illustration, exemplary details in which aspects of the present disclosure may be practiced.

The word "exemplary" is used herein to mean "serving as an example, instance, or illustration". Any aspect or design described herein as "exemplary" is not necessarily to be construed as preferred or advantageous over other aspects or designs.

Throughout the drawings, it should be noted that like reference numbers are used to depict the same or similar elements, features, and structures, unless otherwise noted.

The phrase "at least one" and "one or more" may be understood to include a numerical quantity greater than or equal to one (e.g., one, two, three, four, [ . . . ], etc.). The phrase "at least one of" with regard to a group of elements may be used herein to mean at least one element from the group consisting of the elements. For example, the phrase "at least one of" with regard to a group of elements may be used herein to mean a selection of: one of the listed elements, a plurality of one of the listed elements, a plurality of individual listed elements, or a plurality of a multiple of individual listed elements.

The words "plural" and "multiple" in the description and in the claims expressly refer to a quantity greater than one. Accordingly, any phrases explicitly invoking the aforementioned words (e.g., "plural [elements]", "multiple [elements]") referring to a quantity of elements expressly refers to more than one of the said elements. For instance, the phrase "a plurality" may be understood to include a numerical quantity greater than or equal to two (e.g., two, three, four, five, [ . . . ], etc.).

The phrases "group (of)", "set (of)", "collection (of)", "series (of)", "sequence (of)", "grouping (of)", etc., in the description and in the claims, if any, refer to a quantity equal to or greater than one, i.e., one or more. The terms "proper subset", "reduced subset", and "lesser subset" refer to a subset of a set that is not equal to the set, illustratively, referring to a subset of a set that contains less elements than the set.

The term "data" as used herein may be understood to include information in any suitable analog or digital form, e.g., provided as a file, a portion of a file, a set of files, a signal or stream, a portion of a signal or stream, a set of signals or streams, and the like. Further, the term "data" may also be used to mean a reference to information, e.g., in form of a pointer. The term "data", however, is not limited to the aforementioned examples and may take various forms and represent any information as understood in the art.

The terms "processor" or "controller" as, for example, used herein may be understood as any kind of technological entity that allows handling of data. The data may be handled according to one or more specific functions executed by the processor or controller. Further, a processor or controller as used herein may be understood as any kind of circuit, e.g., any kind of analog or digital circuit. A processor or a controller may thus be or include an analog circuit, digital circuit, mixed-signal circuit, logic circuit, processor, microprocessor, Central Processing Unit (CPU), Graphics Processing Unit (GPU), Digital Signal Processor (DSP), Field Programmable Gate Array (FPGA), integrated circuit, Application Specific Integrated Circuit (ASIC), etc., or any combination thereof. Any other kind of implementation of the respective functions, which will be described below in further detail, may also be understood as a processor, controller, or logic circuit. It is understood that any two (or more) of the processors, controllers, or logic circuits detailed herein may be realized as a single entity with equivalent functionality or the like, and conversely that any single processor, controller, or logic circuit detailed herein may be realized as two (or more) separate entities with equivalent functionality or the like.

As used herein, "memory" is understood as a computer-readable medium (e.g., a non-transitory computer-readable medium) in which data or information can be stored for retrieval. References to "memory" included herein may thus be understood as referring to volatile or non-volatile memory, including random access memory (RAM), read-only memory (ROM), flash memory, solid-state storage, magnetic tape, hard disk drive, optical drive, 3D XPoint™, among others, or any combination thereof. Registers, shift registers, processor registers, data buffers, among others, are also embraced herein by the term memory. The term "software" refers to any type of executable instruction, including firmware.

Unless explicitly specified, the term "transmit" encompasses both direct (point-to-point) and indirect transmission (via one or more intermediary points). Similarly, the term "receive" encompasses both direct and indirect reception. Furthermore, the terms "transmit," "receive," "communicate," and other similar terms encompass both physical transmission (e.g., the transmission of radio signals) and logical transmission (e.g., the transmission of digital data over a logical software-level connection). For example, a processor or controller may transmit or receive data over a software-level connection with another processor or controller in the form of radio signals, where the physical transmission and reception is handled by radio-layer components such as radio frequency (RF) transceivers and antennas, and the logical transmission and reception over the software-level connection is performed by the processors or controllers. The term "communicate" encompasses one or both of transmitting and receiving, i.e., unidirectional or bidirectional communication in one or both of the incoming and outgoing directions. The term "calculate" encompasses both 'direct' calculations via a mathematical expression/formula/relationship and 'indirect' calculations via lookup or hash tables and other array indexing or searching operations.

Base stations may include an antenna array and a receiver. The antenna array may receive multiple receive signals representative of a signal generated by an electronic device. The receiver may sample the receive signals to reconstruct the signal generated by the electronic device. The receiver may be configured to directly sample the receive signals over multiple frequency bands.

Some receiver technologies may consume large amounts of power to achieve a sampling rate capable of sampling the receive signals at a millimeter (mm) frequency (e.g., thirty to three hundred gigahertz (GHz)). In addition, some receiver technologies may include operational limitations such that the receivers are not able to achieve a sampling rate that corresponds to the mm frequency. These limitations may increase a cost associated with operating the receivers at the mm frequency or may prevent the receivers from being able to perform signal sampling of the receive signals at the mm frequency.

Some receiver technologies may include Nyquist data converters that are designed to achieve the sampling rate corresponding to the mm frequency. However, Nyquist data converters may consume large amounts of power to achieve a Nyquist sampling rate corresponding to the mm frequency. For example, the Nyquist data converters may sample the receive signals at a sampling rate that is equal to a corresponding frequency of the mm frequency divided by two. These receiver technologies may directly sample the receive signals if the receive signals are in the RF.

Some receiver technologies may perform sub-sampling to down convert the receive signal from the RF or the mm frequency. These receive technologies may down convert the frequency by sampling different portions of the receive signals during time periods. However, sub-sampling the receive signals may create blocker interference, aliasing interference (e.g., aliasing noise), voltage noise, phase noise, or some combination thereof. These receiver technologies may cause issues with linearity of the samples of the receive signals by not filtering the receive signals.

One or more receiver described in the present disclosure may sample the receive signals at different phases and may include sub-harmonic feedback to permit sampling of the receive signals at the RF frequency, the mm frequency, or a sub-terahertz frequency and to filter noise in the receive signals.

The receiver may include a clock stage, multiple slices, and a beamforming stage. Each of the slices may be electrically coupled to a different antenna of the antenna array and to the clock stage. Each of the slices may receive a corresponding receive signal at a first frequency (e.g., a frequency in the RF, the mm frequency, or the sub-terahertz frequency) from a corresponding antenna. The first frequency may be equal to a sampling rate times the number slices in the receiver. Each of the slices may also receive shifted clock signals at a second frequency from the clock stage. The second frequency may be a sub-harmonic frequency of the first frequency (e.g., a sub-harmonic frequency of the RF, the mm frequency, or the sub-terahertz frequency). Each of the slices may sample the corresponding receive signal using the shifted clock signals.

Each of the slices may include an analog to digital converter (ADC) stage (e.g., interleaved multi-phase ADCs) that operates using the shifted clock signals. Each of the slices may also include a finite impulse response (FIR) filter that filters and combines the output of the ADC stage for each shifted clock signal. The beamforming stage may receive an output of the FIR filters of each of the slices. The beamforming stage may also generate a beamformed signal that includes a beam formed in a direction. Each of the slices may include a digital to analog (DAC) stage (e.g., multi-phase DACs) that operates using the shifted clock signals to cancel blocker interference, voltage noise, phase noise, or some combination thereof of the corresponding receive signal at an input of the ADC stage.

The receiver may include a phased array that includes a clock stage, a beamforming stage, and multiple slices. The clock stage may generate the shifted clock signals at the second frequency. Each of the shifted clock signals may include a different phase. Each of the slices may include a filter stage. The filter stage may receive the corresponding receive signal from the corresponding antenna. The filter stage may also generate a corresponding summed signal by filtering a portion of blocker and noise interference in the corresponding receive signal based on corresponding blocking signals and the shifted clock signals.

The beamforming stage may generate the beamformed signal based on summed signals received from the slices. Each of the slices may include a feedback stage. The feedback stage may generate the corresponding blocking signals based on the shifted clock signals and the corresponding summed signal. The corresponding blocking signals may be representative of the blocker and noise interference in the corresponding receive signal.

One or more receivers described in the present disclosure may permit sub-harmonic down conversion of the frequency of the receive signals and may filter aliasing interference. In addition, one or more receivers described in the present disclosure may permit dynamic range settings of corresponding data converters to be reduced for the RF or the mm frequency compared to receivers that include Nyquist data converters. The ADC stages (e.g., the interleaved ADCs) of the slices may sample the corresponding receive signals at reduced rates compared to Nyquist data converters (e.g., half the sampling of the Nyquist data converters), which may reduce power consumption compared to receivers that include Nyquist data converters.

These and other aspects of the present disclosure will be explained with reference to the accompanying figures. It is to be understood that the figures are diagrammatic and schematic representations of such example aspects, and are not limiting, nor are they necessarily drawn to scale. In the figures, features with like numbers indicate like structure and function unless described otherwise.

FIG. 1 illustrates a block diagram of an exemplary receive path 100 of a base station that includes a phased array 101, in accordance with at least one aspect described in the present disclosure. The receive path 100 may also include an antenna array 132 and a processing circuit 134. The phased array 101 may include a clock stage 102, slices 110a-n, and a beamforming stage 108. As indicated by the ellipsis and the Nth slice 110n in FIG. 1, the slices 110a-n may include any appropriate number of slices 110a-n. The antenna array 132 may include multiple antennas. Each antenna of the antenna array 132 may be electrically coupled to a corresponding slice of the slices 110a-n. The antenna array 132 may include any appropriate number of antennas. The clock stage 102 may include a clock circuit 104 electrically coupled to a phase shifter 106. The phase shifter 106 may be referred to as a multi-phase clock generator.

Each of the slices 110a-n may include a filter stage 112 and a feedback stage 114. In FIG. 1, a detailed view and description of operation of a first slice 110a is provided for simplicity of illustration and discussion. Each of the slices 110a-n may operate accordingly. The filter stage 112 may be electrically coupled to the corresponding antenna of the antenna array 132, the beamforming stage 108, the phase shifter 106, and the feedback stage 114. The feedback stage 114 may be electrically coupled to the beamforming stage 108 and the phase shifter 106.

The filter stage 112 may include a first summer 116 electrically coupled to the corresponding antenna of the antenna array 132. The filter stage 112 may also include an ADC stage 118 electrically coupled to the first summer 116 and the phase shifter 106. The ADC stage 118 may include multiple ADCs. Each ADC of the ADC stage 118 may be electrically coupled to the phase shifter 106 and the first summer 116. In addition, the filter stage 112 may include a FIR filter 120 electrically coupled to the ADC stage 118. The FIR filter 120 may include multiple amplifiers/weighted gain blocks that are each electrically coupled to a different ADC of the ADC stage 118. Further, the filter stage 112 may include a second summer 122 that is electrically coupled to the FIR filter 120 and the beamforming stage 108.

The beamforming stage 108 may include phase shifters 130a-n. As indicated by the ellipsis and the Nth phase shifter 130n in FIG. 1, the beamforming stage 108 may include any appropriate number of phase shifters 130a-n. Each of the phase shifters 130a-n may be electrically coupled to a corresponding slice of the slices 110a-n. For example, a first phase shifter 130a may be electrically coupled to the second summer 122 of the first slice 110a. In addition, the beamforming stage 108 may include a beamforming summer 131 electrically coupled to each of the phase shifters 130a-n.

The feedback stage 114 may include a complex scaling circuit 124 electrically coupled to the beamforming summer 131. The feedback stage 114 may also include a difference amplifier 126 electrically coupled to the second summer 122 and the complex scaling circuit 126. In addition, the feedback stage may include a DAC stage 128 electrically coupled to the phase shifter 106, the difference amplifier 126, and the first summer 116. The DAC stage 128 may include multiple DACs. Each DAC of the DAC stage 128 may be electrically coupled to the difference amplifier 126, the phase shifter 106, and the first summer 116.

The antenna array 132 may receive the receive signals. In addition, each antenna of the antenna array 132 may provide the corresponding receive signal to the corresponding slice of the slices 110a-n. For example, a first antenna of the antenna array 132 may provide the corresponding receive signal to the first summer 116. The corresponding receive signal may include data that is to be sampled by the phased array 101. In addition, the corresponding receive signal may be at the first frequency. Further, the corresponding receive signal may include blocker interference, noise, or other types of interference.

The clock circuit 104 may generate a clock signal at the second frequency that is a constructive sub-harmonic frequency of the first frequency. Examples of sub-harmonic frequencies are illustrated in graph 136. Frequencies marked with an X may be a sub-harmonic frequency that is destructive and not constructive of the first frequency. Frequencies marked with an arrow pointing towards the Y axis may be a sub-harmonic frequency that is constructive of the first frequency. The clock circuit 104 may generate the clock signal at a constructive sub-harmonic frequency of the first frequency. The phase shifter 106 may receive the clock signal at the second frequency. The phase shifter 106 may also shift a phase of the clock signal to generate the shifted clock signals. Each of the shifted clock signals may include a different phase at the second frequency.

The first summer 116 may receive the corresponding receive signal and the blocking signals. The first summer 116 may also generate a blocker signal based on the corresponding receive signal and the blocking signals. The first summer 116 may negate interference within the corresponding receive signal based on the blocking signals by performing phase combination of the corresponding receive signal and the blocking signals. The ADC stage 118 may receive the blocker signal and the shifted clock signals. For example, each ADC of the ADC stage 118 may receive the blocker signal and a corresponding shifted clock signal. The ADC stage 118 may generate digital blocker signals based on the blocker signal and the shifted clock signals. For example, each ADC of the ADC stage 118 may generate a digital blocker signal based on the blocker signal and the corresponding shifted clock signal.

The FIR filter 120 may receive the digital blocker signals. For example, each amplifier/weighted gain block of the FIR filter 120 may receive a corresponding digital blocker signal. The FIR filter 120 may also generate weighted signals based on the digital blocker signals. The FIR filter 120 may generate the weighted signals based on the digital blocker signals and a pre-configured weighting configuration of the FIR filter 120. For example, each amplifier/weighted gain block of the FIR filter 120 may generate a corresponding weighted signal based on the corresponding digital blocker signal a corresponding weighting configuration. The second summer 122 may receive the weighted signals. The second summer 122 may also generate the summed signal based on the weighted signals.

The beamforming stage 108 may receive the summed signal. In addition, the beamforming stage 108 may receive the summed signals generated by each of the slices 110a-n. The beamforming stage 108 may generate a beamformed signal based on the summed signals. The beamformed signal may include a beam formed in a direction.

The complex scaling circuit 124 may receive the beamformed signal. The complex scaling circuit 124 may also generate a scaled signal based on the beamformed signal and a configuration of the first slice 110a. In particular, the complex scaling circuit 124 may generate the scaled signal to include a phase and an amplitude based on the configuration of the first slice 110a. Each complex scaling circuit 124 of the slices 110a-n may shift the phase, the amplitude, or some combination thereof of the corresponding scaled signals based on the corresponding slice of the slices 110a-n.

The difference amplifier 126 may receive the scaled signal and the summed signal. The difference amplifier 126 may also generate a blocker/noise signal based on the difference between the scaled signal and the summed signal. The blocker/noise signal may be representative of the blocker and noise interference in the corresponding receive signal.

The blocker/noise signal may be based on a difference between the summed signal and the scaled signal.

The DAC stage 128 may receive the blocker/noise signal and the shifted clock signals. For example, each DAC of the DAC stage 128 may receive the blocker/noise signal and a corresponding shifted clock signal. The DAC stage 128 may generate the blocking signals based on the blocker/noise signal and the shifted clock signals. For example each DAC of the DAC stage 128 may generate a corresponding blocking signal based on the blocker/noise signal and a corresponding shifted clock signal. The blocking signals may be representative of the blocker and noise interference in the corresponding receive signal.

The processing circuit 134 may include back end processing circuitry. The processing circuit 134 may receive the beamformed signal. The processing circuit 134 may perform various back end processing operations using the beamformed signal.

Figure 2:
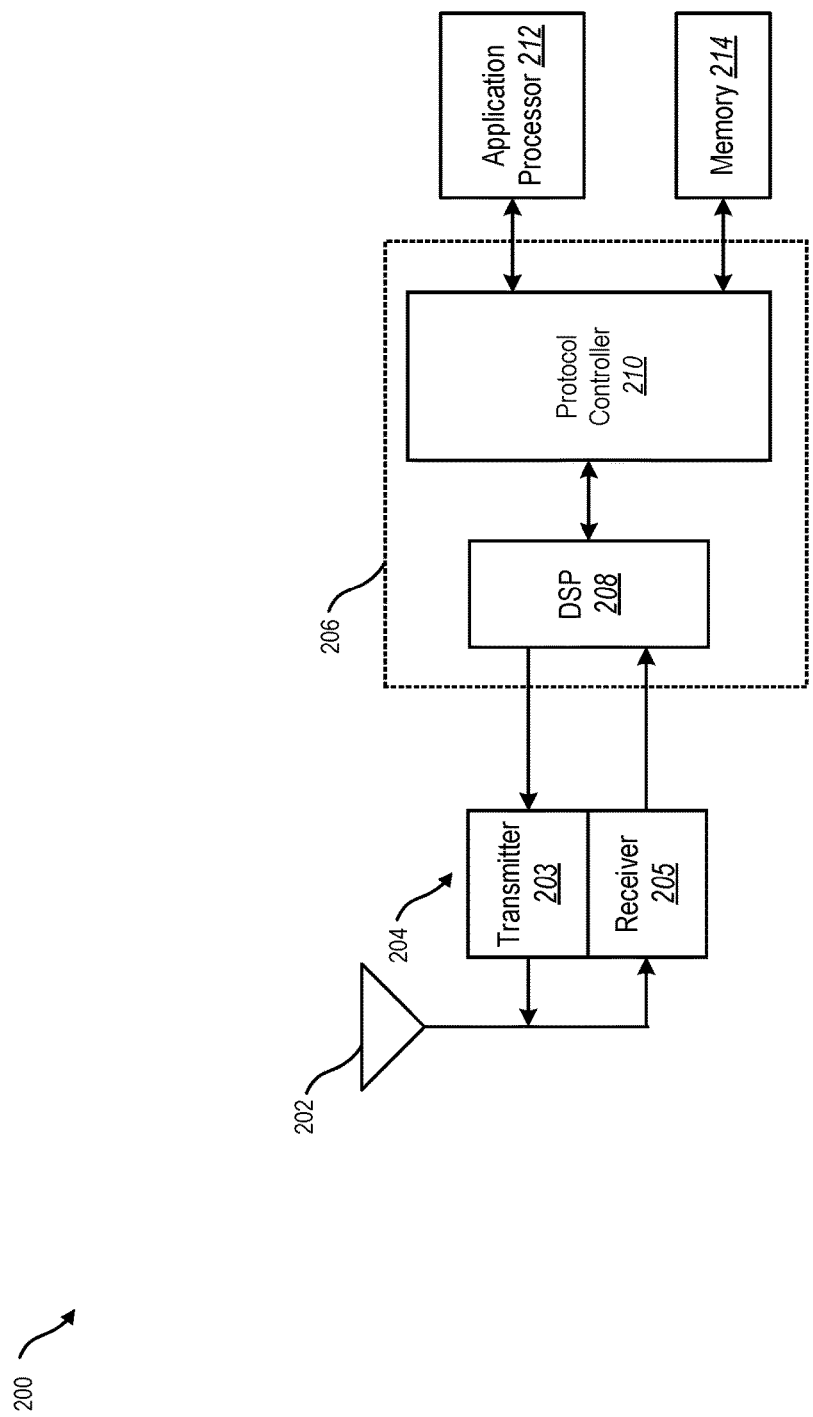
FIG. 2 illustrates a block diagram of an exemplary base station, according to at least one aspect described in the present disclosure.

FIG. 2 illustrates a block diagram of an exemplary base station 200, in accordance with at least one aspect described in the present disclosure. The base station 200 may include an antenna array 202, a transceiver 204, a baseband modem 206, an application processor 212, and a memory 214. The baseband modem 206 may include a DSP 208 and a protocol controller 210. The transceiver 204 may include a transmitter 203 and a receiver 205. The receiver 205 may correspond to the phased array 101 of FIG. 1. The receiver 205 may form part of a receive path, and the transmitter 203 may form part of a transmit path. The baseband modem 206, the application processor 212, the memory 214, or some combination thereof may correspond to the processing circuit 134 of FIG. 1. In addition, the antenna array 202 may correspond to the antenna array 132 of FIG. 1.

Although not explicitly illustrated in FIG. 2, the base station 200 may include one or more additional hardware and/or software components, such as processors/microprocessors, controllers/microcontrollers, other specialty or generic hardware/processors/circuits, peripheral device(s), memory, power supply, external device interface(s), subscriber identity module(s) (SIMs), user input/output devices (display(s), keypad(s), touchscreen(s), speaker(s), external button(s), camera(s), microphone(s), etc.), or other related components.

The baseband modem 206 may direct communication functionality of the base station 200 according to communication protocols. The baseband modem 206 may also execute control over the antenna array 202 and the transceiver 204 to transmit and receive wireless signals according to formatting and scheduling parameters. Although various practical designs may include separate communication components for each supported radio communication technology (e.g., a separate antenna, transceiver, DSP, and controller), for purposes of conciseness, the configuration of the base station 200 illustrated in FIG. 2 depicts only a single instance of such components.

The base station 200 may transmit and receive the wireless signals using the antenna array 202. The antenna array 202 may include one or more antenna arrays that each include multiple antenna elements. For example, the antenna array 202 may include an antenna array at the top of the base station 200 and a second antenna array at the bottom of the base station 200. The antenna array 202 may also include analog combination and/or beamforming circuitry.

The receiver 205 may receive multiple receive signals from the antenna array 202. The receiver 205 may perform analog and digital processing of the receive signals as discussed above in relation to FIG. 1. The receiver 205 may provide the beamformed signals to the baseband modem 206.

The transmitter 203 may receive baseband samples from the baseband modem 206. The transmitter 203 may also perform analog and digital processing of the baseband samples to generate transmit signals. The transmitter 203 may provide the transmit signals to the antenna array 202. The transmitter 203 may include analog and digital transmission components including amplifiers (e.g., Power Amplifiers (PAs), filters, modulators (e.g., in phase quadrature (IQ) modulators), and DACs. The transmitter 203 may mix the baseband samples received from the baseband modem 206 and generate the transmit signals for wireless transmission by the antenna array 202.

The baseband modem 206 may control transmission by the transmitter 203 and reception by the receiver 205. For example, the baseband modem 206 may specify frequencies for operation of the transmitter 203 and the receiver 205.

The DSP 208 may perform physical layer (PHY, Layer 1) transmission and reception processing in the transmit path. The DSP 208 may generate the baseband samples based on outgoing transmit data provided by the protocol controller 210. In addition, the DSP 208 may perform the physical layer reception processing, in the receive path. The DSP 209 may process the beamformed signals received from the receiver 205. The DSP 208 may perform one or more of error detection, forward error correction encoding/decoding, channel coding and interleaving, channel modulation/demodulation, physical channel mapping, radio measurement and search, frequency and time synchronization, antenna diversity processing, power control and weighting, rate matching/de-matching, retransmission processing, interference cancelation, and any other physical layer processing functions. The DSP 208 may be structurally realized as hardware components (e.g., as one or more digitally-configured hardware circuits or FPGAs), software-defined components (e.g., one or more processors configured to execute program code defining arithmetic, control, and I/O instructions (e.g., software and/or firmware) stored in a non-transitory computer-readable storage medium), or as a combination of hardware and software components. The DSP 208 may include one or more processors configured to retrieve and execute program code that defines control and processing logic for physical layer processing operations. The DSP 208 may execute processing functions with software via the execution of executable instructions. The DSP 208 may include one or more dedicated hardware circuits (e.g., ASICs, FPGAs, and other hardware) that are digitally configured to specifically execute processing functions, where the one or more processors of the DSP 208 may offload certain processing tasks to these dedicated hardware circuits, which are known as hardware accelerators. Exemplary hardware accelerators can include Fast Fourier Transform (FFT) circuits and encoder/decoder circuits. The processor and hardware accelerator components of the DSP 208 may include a coupled integrated circuit.

The base station 200 may operate according to one or more radio communication technologies. The protocol controller 210 may perform upper-layer protocol stack functions (e.g., Data Link Layer/Layer 2 and/or Network Layer/Layer 3). The protocol controller 210 may control the antenna array 202, the transceiver 204, and the DSP 208 (e.g., radio communication components of the base station 200) in accordance with the communication protocols of each supported radio communication technology. The protocol controller 210 may represent Access Stratum and Non-Access Stratum (NAS) (also encompassing Layer 2 and Layer 3) of each supported radio communication technology. The protocol controller 210 may include a protocol processor that executes protocol stack software (retrieved from a controller memory (not illustrated in FIG. 2)) to control the antenna array 202, the transceiver 204, and the DSP 208 in accordance with the corresponding protocol stack control logic.

The protocol controller 210 may include one or more processors configured to retrieve and execute program code that defines the upper-layer protocol stack logic for one or more radio communication technologies, which may include Data Link Layer/Layer 2 and Network Layer/Layer 3 functions. The protocol controller 210 may perform both user-plane and control-plane functions to transfer application layer data to and from a radio of the base station 200. User-plane functions may include header compression and encapsulation, security, error checking and correction, channel multiplexing, scheduling and priority, while control-plane functions may include setup and maintenance of radio bearers. The program code retrieved and executed by the protocol controller 210 may include executable instructions that define the logic of the functions.

The application processor 212 may perform operations corresponding to layers above the protocol stack, including transport and application layers. The application processor 212 may execute various applications and/or programs of the base station 200 at an application layer. For example, the application processor 212 may execute an operating system (OS), a user interface (UI) for supporting user interaction with the base station 200, and/or various user applications. The application processor 212 may include a CPU.

The application processor 212 may interface with the baseband modem 206 and act as a source (in the transmit path) and a sink (in the receive path) for user data, such as voice data, audio/video/image data, messaging data, application data, basic Internet/web access data, etc. In the transmit path, the protocol controller 210 may receive and process outgoing data provided by the application processor 212 according to the layer-specific functions of the protocol stack. In addition, the protocol controller 210 may provide the resulting data to the DSP 208. The DSP 208 may perform physical layer processing to generate the baseband samples, which the DSP 208 may provide to the transmitter 203. The transmitter 203 may process the baseband samples and convert them to the transmit signals. The transmitter 203 may provide the transmit signals to the antenna array 202 to be wirelessly transmitted.

In the receive path, the receiver 205 may provide the beamformed signals to the DSP 208, which may perform physical layer processing of the beamformed signals. The DSP 208 may provide the resulting data to the protocol controller 210, which may process the resulting data according to the layer-specific functions of the protocol stack. The protocol controller 210 may provide the resulting incoming data to the application processor 212. The application processor 212 may handle the incoming data at the application layer, which may include execution of one or more application programs with the data and/or presentation of the data to a user via a user interface.

The memory 214 may include a memory circuit or a storage element, such as a hard drive or another such permanent memory device. Although not explicitly illustrated in FIG. 2, the various other components of the base station 200 may include integrated permanent and non-permanent memory components.

Base stations may include an antenna array and a receiver. The antenna array may receive multiple receive signals representative of a signal generated by an electronic device. The receiver may sample the receive signals to reconstruct the signal generated by the electronic device. The receiver may be configured to directly sample the receive signals over multiple bands.

Some receiver technologies may consume large amounts of power to achieve a sampling rate capable of sampling the receive signals at a mm frequency (e.g., thirty to three hundred GHz). In addition, some receiver technologies may include operational limitations such that the receivers are not able to achieve a sampling rate that corresponds to the mm frequency. These limitations may increase a cost associated with operating the receivers at the mm frequency or may prevent the receivers from being able to perform signal sampling of the receive signals at the mm frequency.

Some receiver technologies may include Nyquist data converters that are designed to achieve the sampling rate corresponding to the mm frequency. However, Nyquist data converters may consume large amounts of power to achieve a Nyquist sampling rate corresponding to the mm frequency. For example, the Nyquist data converters may sample the receive signals at a sampling rate that is equal to a corresponding frequency of the mm frequency divided by two. These receiver technologies may directly sample the receive signals if the receive signals are in the RF.

Some receiver technologies may perform sub-sampling to down convert the receive signal from the RF or the mm frequency. These receive technologies may down convert the frequency by sampling different portions of the receive signals during time periods. However, sub-sampling the receive signals may create blocker interference, aliasing interference (e.g., aliasing noise), voltage noise, phase noise, or some combination thereof. These receiver technologies may cause issues with linearity of the samples of the receive signals by not filtering the receive signals.

The receiver may include a phased array that includes a clock stage, multiple slices, and a beamforming stage. Each of the slices may be electrically coupled to a different antenna of the antenna array and to the clock stage. Each of the slices may receive a corresponding receive signal at a first frequency (e.g., a frequency in the RF, the mm frequency, or the sub-terahertz frequency) from a corresponding antenna. The first frequency may be equal to a sampling frequency times N (e.g., a number of slices in the receiver). Each of the slices may also receive shifted clock signals at a second frequency from the clock stage. The second frequency may be a sub-harmonic frequency of the first frequency (e.g., a sub-harmonic frequency of the RF, the mm frequency, or the sub-terahertz frequency). Each of the slices may sample the corresponding receive signal using the shifted clock signals.

The clock stage may generate shifted clock signals (e.g., N-phase clock signals). Each of the shifted clock signals may include a different phase. In addition, each of the shifted clock signals may be at a second frequency that is a sub-harmonic frequency of the first frequency (e.g., equal to a sampling frequency of the first frequency). The clock stage may include a phase generator that may be referred to as a multi-phase clock generator. The phase generator may generate the shifted clock signals at the second frequency based on a clock signal (e.g., a sub-harmonic clock) from a clock circuit. The phase generator may include a delayed lock loop (DLL) circuit, a phase interpolation circuit, or some combination thereof. Each of the shifted clock signals may include a different phase. A difference between the phases of the shifted clock signals may be equal to each other.

The phase generator may shift the phases of the shifted clock signals to be at a fundamental clock frequency or another-subharmonic frequency (e.g., an $N^{th}$ harmonic in which N may be equal to a number of phases to be cancelled).

Each of the slices may include a filter stage and a feedback stage. The receiver may include any appropriate number of slices. For simplicity of discussion, a description of a single slice is provided. Each of the slices may operate accordingly. The filter stage may receive the corresponding receive signal, the shifted clock signals, and the blocking signals. The filter stage may generate a summed signal. The filter stage may filter a portion of blocker and noise interference in the corresponding receive signal based on the blocking signals and the shifted clock signals.

The filter stage may include a first summer. The first summer may receive the corresponding receive signal and the blocking signals. The first summer may also generate a blocker signal based on the corresponding receive signal and the blocking signals. For example, the first summer may perform phase combination to cancel aliases of the corresponding receive signal that occur during sub-sampling.

The filter stage may include an ADC stage. The ADC stage may down convert the frequency to a baseband frequency through sub-sampling. For example, the ADC stage may receive the blocker signal at the first frequency and may generate the digital blocker signal at a baseband frequency. The ADC stage may include a multi-phase ADC that is separated into interleaved ADC slices (e.g., each ADC of the ADC stage may form an ADC slice).

The ADC stage may receive the blocker signal and the shifted clock signals. The blocker signal may include an error signal that is fed back to an input of the ADC stage to filter out a portion of interference in the corresponding receive signal. The ADC stage may also generate digital blocker signals based on the blocker signal and the shifted clock signals. The ADC stage may include multiple ADCs. Each ADC of the ADC stage may receive the blocker signal and a corresponding shifted clock signal. In addition, each ADC of the ADC stage may generate a corresponding digital blocker signal based on the blocker signal and the corresponding shifted clock signal. A number of ADCs in the ADC stage may correspond to the first frequency of the receive signal. For example, the number of ADCs in the ADC stage may be higher for higher values of the first frequency compared to lower values of the first frequency.

The filter stage may include a FIR filter. The FIR filter may receive the digital blocker signals. The FIR filter may also generate weighted signals based on the digital blocker signals. The FIR filter may generate the weighted signals based on the digital blocker signals and a pre-configured weighting configuration of the FIR filter. The pre-configured weighting configuration of the FIR filter may be based on a weighting scheme, an averaging scheme, a window scheme, a mean square error scheme, or some combination thereof.

The FIR filter may include multiple amplifiers/weighted gain blocks. Each amplifier/weighted gain block of the FIR filter may be electrically coupled to a different ADC of the ADC stage. Each amplifier/weighted gain block of the FIR filter may perform operations according to the pre-configured weighting configuration using a corresponding digital blocker signal. The FIR filter may filter noise, interference, or some combination thereof in addition to the first summer, the ADC stage, or some combination thereof.

The second summer may receive the weighted signals. The second summer may also generate a summed signal based on the weighted signals. For example, the second summer may combine each of the weighted signals into single signal. The second summer may add each of the weighted signals on each phase.

The beamforming stage may receive each of the summed signals generated by the slices. The beamforming stage may also generate a beamformed signal that includes a beam formed in a direction based on the summed signals. The beamforming stage may include a phase shifter for each slice and a beamforming summer. Each of the phase shifters may shift a phase of the corresponding summed signal. In addition, the beamforming summer may sum each of the phase shifted summed signals on each phase to generate the beamformed signal.

The beamforming stage may align the phase and amplitude of each summed signal. The beamformed signal may be used by the feedback stage as feedback and may be compared to a corresponding summed signal to generate the corresponding blocking signals. The blocking signals may include blocker and noise interference corresponding to blockers and noise of the corresponding receive signals.

The feedback stage may generate the blocking signals based on the shifted clock signals and the corresponding summed signal. The feedback stage may perform negative feedback in which the blocking signals are representative of an inverse of the noise, interference, or some combination thereof of the corresponding receive signal.

The feedback stage may receive the beamformed signal, the corresponding summed signal, and the shifted clock signals. The feedback stage may generate a scaled signal (e.g., a desired signal) based on the beamformed signal. A phase and an amplitude of the scaled signal may be based on a configuration of the corresponding slice.

The feedback stage may include a complex scaling circuit. The complex scaling circuit may receive the beamformed signal. The complex scaling circuit may also generate the scaled signal based on the beamformed signal and the configuration of the corresponding slice. The complex scaling circuit may align the phase and amplitude based on a phase setting, an amplitude setting, or some combination thereof of the corresponding slice.

The feedback stage may include a difference amplifier. The difference amplifier may receive the scaled signal and the summed signal. The difference amplifier may also generate a blocker/noise signal based on the difference between the scaled signal and the summed signal. For example, the difference amplifier may determine a difference between a phase, an amplitude, or some combination thereof of the scaled signal and the summed signal. The blocker/noise signal may be representative of the difference between the scaled signal and the summed signal.

The blocker/noise signal may be representative of the blocker and noise interference of the corresponding receive signal. The blocker/noise signal may be representative of a phase noise of the clock signal, the shifted clock signal, or some combination thereof. In addition, the blocker/noise signal may be representative of interference of the corresponding receive signal, phase interference of the corresponding antenna, amplitude interference of the corresponding antenna, or some combination thereof. The difference amplifier may sum a charge, a current, or some combination thereof of the scaled signal and the summed signal.

The feedback stage may include a DAC stage. The DAC stage may up convert the frequency of the blocker/noise signal to the first frequency. The DAC stage may receive the blocker/noise signal and the shifted clock signals. The DAC stage may generate the blocking signals based on the blocker/noise signal and the shifted clock signals. The DAC stage may include multiple DACs. Each DAC of the DAC stage may receive the blocker/noise signal and a corresponding shifted clock signal. In addition, each DAC of the DAC stage may generate a corresponding blocking signal based on the blocker/noise signal and the corresponding shifted clock signal.

The digital portions of the receiver (e.g., the FIR filter, the second summer, the beamformer, the complex scaling circuit, and the DAC stage) may operate using a polyphase implementation. The polyphase implementation may permit a reduced clock rate and parallel processing of the various signals.

A phased array may include a clock stage, a beamforming stage, and multiple slices. Each of the slices may be electrically coupled to a different antenna of a receive antenna array. Each of the slices may receive a corresponding receive signal from a corresponding receive antenna. The corresponding receive signal may include data that is to be sampled by the phased array. In addition, the corresponding receive signal may be at a first frequency. The clock stage may generate shifted clock signals. Each of the shifted clock signal may include a different phase.

Each of the slices may include a filter stage and a feedback stage. The filter stage may be electrically coupled to the clock stage and the beamforming stage. The filter stage may generate a corresponding summed signal by filtering a portion of blocker and noise interference in the corresponding receive signal.

The filter stage may include a first summer. The first summer may be electrically coupled to a corresponding antenna of the antenna array. The first summer may receive the corresponding receive signal and the blocking signals. The first summer may also generate a blocker signal based on the corresponding receive signal and the blocking signals.

The filter stage may include an ADC stage electrically coupled to the first summer and the clock stage. The ADC stage may receive the blocker signal and the shifted clock signals. The ADC stage may also generate digital blocker signals based on the blocker signal and the shifted clock signals.

The ADC stage may include multiple ADCs. Each ADC of the ADC stage may be electrically coupled to the clock stage and the first summer. Each ADC of the ADC stage may receive the blocker signal and a corresponding shifted clock signal. Each ADC of the ADC stage may also generate a corresponding digital blocker signal based on the corresponding shifted clock signal and the blocker signal.

The filter stage may include a FIR filter electrically coupled to the ADC stage. The FIR filter may be electrically coupled to each ADC of the ADC stage. The FIR filter may include multiple amplifiers/weighted gain blocks. Each amplifier/weighted gain block of the FIR filter may be electrically coupled to a different ADC of the ADC stage. The FIR filter may receive the digital blocker signals. The FIR filter may also generate weighted signals based on the digital blocker signals and a pre-configured weighting configuration of the FIR filter.

The filter stage may include a second summer. The second summer may be electrically coupled to the FIR filter and the beamforming stage. In particular, the second summer may be electrically coupled to each amplifier/weighted gain block of the FIR filter. The second summer may receive weighted signals. The second summer may also generate the corresponding summed signal based on the weighted signals.

The beamforming stage may be electrically coupled to each slice of the phased array. The beamforming stage may also receive summed signals from each slice of the phased array. The beamforming stage may generate a beamformed signal based on the summed signals. The beamformed signal may include a beam formed in a particular direction.

The feedback stage may be electrically coupled to the clock stage, the filter stage, and the beamforming stage. The feedback stage may generate the blocking signals based on the shifted clock signals and the corresponding summed signal.

The feedback stage may include a complex scaling circuit electrically coupled to the beamforming stage. The complex scaling circuit may receive the beamformed signal. The complex scaling circuit may also generate the scaled signal based on the beamformed signal and the configuration of the corresponding slice.

The feedback stage may include a difference amplifier electrically coupled to the second summer and the complex scaling circuit. The difference amplifier may receive the scaled signal and the corresponding summed signal. The difference amplifier may also generate a blocker/noise signal. The blocker/noise signal may be generated based on a difference between the scaled signal and the corresponding summed signal. The blocker/noise signal may be representative of the blocker and noise interference of the corresponding receive signal.

The feedback stage may include a DAC stage electrically coupled to the clock stage and the difference amplifier. The DAC stage may receive the blocker/noise signal and the shifted clock signals. The DAC stage may also generate the blocking signals based on the blocker/noise signal and the shifted clock signals. The DAC stage may include multiple DACs. Each DAC of the DAC stage may be electrically coupled to the difference amplifier and the clock stage. Each DAC of the DAC stage may receive the blocker/noise signal and a corresponding shifted clock signal. Each DAC of the DAC stage may also generate a corresponding blocking signal based on the blocker/noise signal and a corresponding shifted clock signal.

A phased array may include a clock stage, a beamforming stage, and multiple slices. Each of the slices may be electrically coupled to a different antenna of a receive antenna array. Each of the slices may receive a corresponding analog receive signal from the corresponding receive antenna. The corresponding analog receive signal may include data that is to be sampled by the phased array. In addition, the corresponding analog receive signal may be at a first frequency.

The clock stage may generate phase shifted clock signals. Each of the phase shifted clock signals may include a different phase. The clock stage may include a phase generator (e.g., a multi-phase clock generator). The phase generator may receive a clock signal at a second frequency that is a sub-harmonic frequency of the first frequency. The phase generator may generate the phase shifted clock signals at the second frequency based on the clock signal.

Each of the slices may include a filter stage and a feedback stage. The filter stage may receive a corresponding analog receive signal, the phase shifted clock signals, and analog blocking signals. The corresponding analog receive signal may include blocker and noise interference. The filter stage may also generate a corresponding digital summed signal by filtering a portion of the blocker and noise interference of the corresponding analog receive signal based on the analog blocking signals and the phase shifted clock signals.

The filter stage may include a first summer. The first summer may receive the corresponding analog receive signal and the analog blocking signals. The first summer may also generate an analog blocker signal based on the corresponding analog receive signal and the analog blocking signals.

The filter stage may include an ADC stage that includes multiple ADCs. Each ADC of the ADC stage may receive the analog blocker signal and a corresponding phase shifted clock signal. Each ADC of the ADC stage may generate a corresponding digital blocker signal based on the analog blocker signal and the corresponding phase shifted clock signal.

The filter stage may include a FIR filter. The FIR filter may receive the digital blocker signals. The FIR filter may also generate digital weighted signals based on the digital blocker signals and a pre-configured weighting configuration of the FIR filter. The filter stage may include a second summer. The second summer may receive the digital weighted signals. The second summer may also generate the corresponding digital summed signal based on the digital weighted signals.

The beamforming stage may generate a digital beamformed signal that includes a beam formed in a particular direction based on the digital summed signals. The beamforming stage may include a digital beamformer. The digital beamformer may receive the digital summed signals. The digital beamformer may receive a digital summed signal for each of the slices. The digital beamformer may also generate the digital beamformed signal based on the digital summed signals.

The feedback stage may receive the digital beamformed signal, the corresponding digital summed signal, and the phase shifted clock signals. The feedback stage may also generate a digital scaled signal based on the digital beamformed signal. A phase and an amplitude of the digital scaled signal may be based on a configuration of the corresponding slice. In addition, the feedback stage may generate the analog blocking signals based on the phase shifted clock signals and a difference between the corresponding digital summed signal and the digital scaled signal. The analog blocking signals may be representative of the blocker and noise interference in the corresponding analog receive signal.

The feedback stage may include a complex scaling circuit. The complex scaling circuit may receive the digital beamformed signal. The complex scaling circuit may also generate the digital scaled signal based on the digital beamformed signal and the configuration of the corresponding slice.

The feedback stage may include a difference amplifier. The difference amplifier may receive the digital scaled signal and the corresponding digital summed signal. The difference amplifier may also generate a digital blocker/noise signal based on the difference between the digital scaled signal and the corresponding digital summed signal. The digital blocker/noise signal may be representative of the blocker and noise interference in the corresponding analog receive signal.

The feedback stage may include a DAC stage that includes multiple DACS. Each DAC of the DAC stage may receive the digital blocker/noise signal and a corresponding phase shifted clock signal. Each DAC of the DAC stage may generate a corresponding analog blocking signal based on the digital blocker noise signal and the corresponding phase shifted clock signal.

One or more receivers described in the present disclosure may permit sub-harmonic down conversion of the receive signals at the RF, the mm frequency, or the sub-terahertz frequency and may filter aliasing interference. In addition, one or more receivers described in the present disclosure may permit dynamic range settings to be reduced for a sampling rate of data converters corresponding to the RF, the mm frequency, or the sub-terahertz frequency compared to receivers that include Nyquist data converters. The ADC stages (e.g., the interleaved ADCs) of the slices may sample the corresponding receive signals at reduced rates compared to Nyquist data converters (e.g., half the sampling of the Nyquist data converters), which may reduce power consumption compared to the Nyquist data converters.

While the above descriptions and connected figures may depict electronic device components as separate elements, skilled persons will appreciate the various possibilities to combine or integrate discrete elements into a single element. Such may include combining two or more circuits for form a single circuit, mounting two or more circuits onto a common chip or chassis to form an integrated element, executing discrete software components on a common processor core, etc. Conversely, skilled persons will recognize the possibility to separate a single element into two or more discrete elements, such as splitting a single circuit into two or more separate circuits, separating a chip or chassis into discrete elements originally provided thereon, separating a software component into two or more sections and executing each on a separate processor core, etc.

It is appreciated that implementations of methods detailed herein are demonstrative in nature, and are thus understood as capable of being implemented in a corresponding device. Likewise, it is appreciated that implementations of devices detailed herein are understood as capable of being implemented as a corresponding method. It is thus understood that a device corresponding to a method detailed herein may include one or more components configured to perform each aspect of the related method.

All acronyms defined in the above description additionally hold in all claims included herein.

What is claimed is:

1. A phased array, comprising:
 a clock stage configured to generate a plurality of shifted clock signals, each shifted clock signal of the plurality of shifted clock signals comprising a different phase;
 a beamforming stage configured to generate a beamformed signal comprising a beam formed in a direction based on a plurality of summed signals; and
 a plurality of slices, each slice of the plurality slices comprising:
  a filter stage configured to generate a corresponding summed signal of the plurality of summed signals by filtering a portion of blocker and noise interference in a corresponding receive signal of a plurality of receive signals based on a plurality of blocking signals and the plurality of shifted clock signals; and
  a feedback stage configured to generate the plurality of blocking signals based on the plurality of shifted clock signals and the corresponding summed signal, the plurality of blocking signals representative of the blocker and noise interference in the corresponding receive signal, wherein the feedback stage is further configured to:
   generate a scaled signal based on the beamformed signal, wherein a phase and an amplitude of the scaled signal is based on a configuration of a corresponding slice of the plurality of slices; and generate the plurality of blocking signals based on the plurality of shifted clock signals and a difference between the corresponding summed signal and the scaled signal.

2. The phased array of claim 1, wherein the feedback stage is further configured to:
receive the beamformed signal, the corresponding summed signal, and the plurality of shifted clock signals.

3. The phased array of claim 1, wherein the filter stage is further configured to:
receive the corresponding receive signal, the plurality of shifted clock signals, and the plurality of blocking signals; and
generate the corresponding summed signal by filtering the portion of the blocker and noise interference in the corresponding receive signal based on the plurality of blocking signals and the plurality of shifted clock signals.

4. The phased array of claim 3, wherein the feedback stage further configured to:
receive the beamformed signal, the corresponding summed signal, and the plurality of shifted clock signals;
generate a scaled signal based on the beamformed signal, a phase and an amplitude of the scaled signal based on a configuration of the corresponding slice of the plurality of slices; and
generate the plurality of blocking signals based on the plurality of shifted clock signals and a difference between the corresponding summed signal and the scaled signal.

5. The phased array of claim 1, wherein the filter stage comprises:
a first summer configured to:
receive the corresponding receive signal and the plurality of blocking signals; and
generate a blocker signal based on the corresponding receive signal and the plurality of blocking signals;
an analog to digital converter (ADC) stage configured to:
receive the blocker signal and the plurality of shifted clock signals; and
generate a plurality of digital blocker signals based on the blocker signal and the plurality of shifted clock signals;
a finite impulse response (FIR) filter configured to:
receive the plurality of digital blocker signals; and
generate a plurality of weighted signals based on the plurality of digital blocker signals and a pre-configured weighting configuration; and
a second summer configured to:
receive the plurality of weighted signals; and
generate the corresponding summed signal based on the plurality of weighted signals.

6. The phased array of claim 5, wherein the ADC stage comprises a plurality of ADCs, each ADC of the plurality of ADCs configured to:
receive the blocker signal and a corresponding shifted clock signal of the plurality of shifted clock signals; and
generate a corresponding digital blocker signal of the plurality of digital blocker signals based on the corresponding shifted clock signal and the blocker signal.

7. The phased array of claim 1, wherein the feedback stage comprises:
a complex scaling circuit configured to:
receive the beamformed signal; and
generate the scaled signal based on the beamformed signal and the configuration of the corresponding slice of the plurality of slices;
a difference amplifier configured to:
receive the scaled signal and the corresponding summed signal; and
generate a blocker/noise signal based on the difference between the scaled signal and the corresponding summed signal, the blocker/noise signal representative of the blocker and noise interference; and
a digital to analog converter (DAC) stage configured to:
receive the blocker/noise signal and the plurality of shifted clock signals; and
generate the plurality of blocking signals based on the blocker/noise signal and the plurality of shifted clock signals.

8. The phased array of claim 7, wherein the DAC stage comprises a plurality of DACs, each DAC of the plurality of DACs configured to:
receive the blocker/noise signal and a corresponding shifted clock signal of the plurality of shifted clock signals; and
generate a corresponding blocking signal of the plurality of blocking signals based on the corresponding shifted clock signal and the blocker/noise signal.

9. The phased array of claim 1, wherein the corresponding receive signal is at a first frequency and the clock stage comprises a multi-phase clock generator configured to:
receive a clock signal at a second frequency that is a sub-harmonic frequency of the first frequency; and
generate the plurality of shifted clock signals at the second frequency based on the clock signal.

10. The phased array of claim 1, wherein the beamforming stage comprises a beamformer configured to:
receive the plurality of summed signals, wherein a summed signal of the plurality of summed signals is received for each slice of the plurality of slices; and
generate the beamformed signal based on the plurality of summed signals.

11. A base station, comprising:
a clock stage configured to generate a plurality of shifted clock signals, each shifted clock signal of the plurality of shifted clock signals comprising a different phase;
a beamforming stage configured to generate a beamformed signal comprising a beam formed in a direction based on a plurality of summed signals; and
a plurality of slices, each slice of the plurality slices comprising:
a filter stage electrically coupled to the clock stage and the beamforming stage, the filter stage configured to generate a corresponding summed signal of the plurality of summed signals by filtering a portion of blocker and noise interference in a corresponding receive signal of a plurality of receive signals; and
a feedback stage electrically coupled to the clock stage, the filter stage, and the beamforming stage, the feedback stage configured to generate a plurality of blocking signals representative of the blocker and noise interference in the corresponding receive signal based on the plurality of shifted clock signals and the corresponding summed signal, wherein the feedback stage is further configured to:
generate a scaled signal based on the beamformed signal, wherein a phase and an amplitude of the scaled signal is based on a configuration of a corresponding slice of the plurality of slices; and generate the plurality of blocking signals based on the plurality of shifted clock signals and a difference between the corresponding summed signal and the scaled signal.

12. The base station of claim 11, wherein the filter stage comprises:
a first summer configured to:
receive the corresponding receive signal and the plurality of blocking signals; and
generate a blocker signal based on the corresponding receive signal and the plurality of blocking signals;
an analog to digital converter (ADC) stage electrically coupled to the first summer and the clock stage, the ADC stage configured to:
receive the blocker signal and the plurality of shifted clock signals; and
generate a plurality of digital blocker signals based on the blocker signal and the plurality of shifted clock signals;
a finite impulse response (FIR) filter electrically coupled to the ADC stage, the FIR filter configured to:
receive the plurality of digital blocker signals; and
generate a plurality of weighted signals based on the plurality of digital blocker signals and a pre-configured weighting configuration; and
a second summer electrically coupled to the FIR filter and the beamforming stage, the second summer configured to:
receive the plurality of weighted signals; and
generate the corresponding summed signal based on the plurality of weighted signals.

13. The base station of claim 12, wherein the ADC stage comprises a plurality of ADCs, each ADC of the plurality of ADCs electrically coupled to the clock stage, the first summer, and the FIR filter, each ADC of the plurality of ADCs configured to:
receive the blocker signal and a corresponding shifted clock signal of the plurality of shifted clock signals; and
generate a corresponding digital blocker signal of the plurality of digital blocker signals based on the corresponding shifted clock signal and the blocker signal.

14. The base station of claim 11, wherein the feedback stage comprises:
a complex scaling circuit electrically coupled to the beamforming stage, the complex scaling circuit configured to:
receive the beamformed signal; and
generate the scaled signal based on the beamformed signal and the configuration of the corresponding slice of the plurality of slices;
a difference amplifier electrically coupled to the filter stage and the complex scaling circuit, the difference amplifier configured to:
receive the scaled signal and the corresponding summed signal; and
generate a blocker/noise signal based on the difference between the scaled signal and the corresponding summed signal, the blocker/noise signal representative of the blocker and noise interference; and
a digital to analog converter (DAC) stage electrically coupled to the clock stage and the difference amplifier, the DAC stage configured to:
receive the blocker/noise signal and the plurality of shifted clock signals; and
generate the plurality of blocking signals based on the blocker/noise signal and the plurality of shifted clock signals.

15. The base station of claim 14, wherein the DAC stage comprises a plurality of DACs, each DAC of the plurality of DACs electrically coupled to the difference amplifier and the filter stage.

16. A phased array, comprising:
a clock stage configured to generate a plurality of phase shifted clock signals, each phase shifted clock signal of the plurality of phase shifted clock signals comprising a different phase;
a beamforming stage configured to generate a digital beamformed signal comprising a beam formed in a direction based on a plurality of digital summed signals; and
a plurality of slices, each slice of the plurality slices comprising:
a filter stage configured to:
receive a corresponding analog receive signal of a plurality of analog receive signals, the plurality of phase shifted clock signals, and a plurality of analog blocking signals, the corresponding analog receive signal comprising blocker and noise interference; and
generate a corresponding digital summed signal of the plurality of digital summed signals by filtering a portion of the blocker and noise interference of the corresponding analog receive signal based on the plurality of analog blocking signals and the plurality of phase shifted clock signals; and
a feedback stage configured to:
receive the digital beamformed signal, the corresponding digital summed signal, and the plurality of phase shifted clock signals;
generate a digital scaled signal based on the digital beamformed signal, a phase and an amplitude of the digital scaled signal based on a configuration of a corresponding slice of the plurality of slices; and
generate the plurality of analog blocking signals based on the plurality of phase shifted clock signals and a difference between the corresponding digital summed signal and the digital scaled signal, the plurality of analog blocking signals representative of the blocker and noise interference in the corresponding analog receive signal.

17. The phased array of claim 16, wherein the filter stage comprises:
a first summer configured to:
receive the corresponding analog receive signal and the plurality of analog blocking signals; and
generate an analog blocker signal based on the corresponding analog receive signal and the plurality of analog blocking signals;
a plurality of analog to digital converters (ADCs), each ADC of the plurality of ADCs configured to:
receive the analog blocker signal and a corresponding phase shifted clock signal of the plurality of phase shifted clock signals; and
generate a corresponding digital blocker signal of a plurality of digital blocker signals based on the analog blocker signal and the corresponding phase shifted clock signal;
a finite impulse response (FIR) filter configured to:
receive the plurality of digital blocker signals; and generate a plurality of digital weighted signals based on the plurality of digital blocker signals and a preconfigured weighting configuration; and a second summer configured to:
receive the plurality of digital weighted signals; and
generate the corresponding digital summed signal based on the plurality of digital weighted signals.

18. The phased array of claim 16, wherein the feedback stage comprises:
a complex scaling circuit configured to:
receive the digital beamformed signal; and
generate the digital scaled signal based on the digital beamformed signal and the configuration of the corresponding slice of the plurality of slices;
a difference amplifier configured to:
receive the digital scaled signal and the corresponding digital summed signal; and
generate a digital blocker/noise signal based on the difference between the digital scaled signal and the corresponding digital summed signal, the digital blocker/noise signal representative of the blocker and noise interference in the corresponding analog receive signal; and
a plurality of digital to analog converters (DAC), each DAC of the plurality of DACs configured to:
receive the digital blocker/noise signal and a corresponding phase shifted clock signal of the plurality of phase shifted clock signals; and
generate a corresponding analog blocking signal of a plurality of analog blocking signals based on the digital blocker noise signal and the corresponding phase shifted clock signal of the plurality of phase shifted clock signals.

19. The phased array of claim 16 wherein the corresponding analog receive signal is at a first frequency and the clock stage comprises a multi-phase clock generator configured to:
receive a clock signal at a second frequency that is a sub-harmonic frequency of the first frequency; and
generate the plurality of phase shifted clock signals at the second frequency based on the clock signal.

20. The phased array of claim 16, wherein the beamforming stage comprises a digital beamformer configured to:
receive the plurality of digital summed signals, wherein a digital summed signal of the plurality of digital summed signals is received for each slice of the plurality of slices; and
generate the digital beamformed signal based on the plurality of digital summed signals.

* * * * *